United States Patent [19]
Feldle et al.

[11] Patent Number: 5,408,204
[45] Date of Patent: Apr. 18, 1995

[54] AMPLITUDE LIMITER

[75] Inventors: Heinz-Peter Feldle, Senden; Bernhard Schweizer, Ulm, both of Germany

[73] Assignee: Deutsche Aerospece AG, Munich, Germany

[21] Appl. No.: 133,085

[22] PCT Filed: Jul. 8, 1992

[86] PCT No.: PCT/EP92/01535
§ 371 Date: Oct. 6, 1993
§ 102(e) Date: Oct. 6, 1993

[87] PCT Pub. No.: WO93/16526
PCT Pub. Date: Aug. 19, 1993

[30] Foreign Application Priority Data
Feb. 13, 1992 [DE] Germany .......... 42 04 199.6

[51] Int. Cl.⁶ .......... H01P 5/04; H01P 1/22
[52] U.S. Cl. .......... 333/17.2; 455/78
[58] Field of Search .......... 333/17.2, 81 A

[56] References Cited

U.S. PATENT DOCUMENTS

| | | | |
|---|---|---|---|
| 3,943,467 | 3/1976 | Yamada et al. | 333/17.2 |
| 4,371,851 | 2/1983 | Niehenke et al. | 333/17.2 |
| 4,754,240 | 6/1988 | Marconi | 333/81 A |
| 4,930,035 | 5/1990 | Viana et al. | 361/54 |

FOREIGN PATENT DOCUMENTS 102902  4/1991  Japan .......... 333/17.2

OTHER PUBLICATIONS

1988 IEEE MTT International Microwave Symposium digest, May 25–27, 1988, vol. 1, IEEE New York US, pp. 255–258; D. J. Seymour et al.: "X–Band and Ka–Band Monolithic GaAs PIN Diode Variable Attenuation Limiters".

Primary Examiner—Paul Gensler
Attorney, Agent, or Firm—Spencer, Frank & Schneider

[57] ABSTRACT

An amplitude limiter including an input power divider, first and second circuit branches each having an input end coupled to receive a split input signal and each being substantially identical electrically parallel-connected branches, each circuit branch being composed of a series connection of first and second conductor sections with the first and second conductor sections having respectively different lengths, and with the first and second conductor sections of each circuit branch being connected in anti-parallel, an absorber resistor connected between the two respective input ends of the circuit branches, and first and second rectifiers with each respective rectifier being connected between a connection point between the first and second conductor sections of each respective circuit branch and a ground conductor.

11 Claims, 1 Drawing Sheet

AMPLITUDE LIMITER

BACKGROUND OF THE INVENTION

1. Field of the Invention

The invention relates to an amplitude limiter. More particularly, the present invention relates to an amplitude limiter which reflects a high-frequency signal that exceeds a predetermined threshold.

2. Description Of The Related Art

In many high-frequency applications, particularly in the radar art or in satellite radio, high power high-frequency (HF) transmitters, on the one hand, and highly sensitive high-frequency (HF) receivers, on the other hand, are operated in immediate spatial vicinity. Often HF transmitters and HF receivers are operated in time division multiplex over a common transmit/receive antenna. This is the case, for example, in active, phased array antennas in which, for example, up to several thousand individual antennas (transmit (T) and receive (R) antennas) are combined into an antenna array. With such an antenna array it is possible to pivot the antenna lobe by providing adjustable phase shifters at the individual antennas for the HF signals to be transmitted or received. In such arrangements, mentioned as examples, so-called transmitter (T), receiver (R) or transceiver (T/R) modules perform a very important function. It is often advisable to construct such modules as a unit of the smallest possible three-dimensional size, for example, in the case of a phased array antenna for the nose of an aircraft.

An exemplary configuration with respect to HF for such a T/R module is shown in FIG. 1. This module is essentially composed of:
- a receiving path;
- a transmission path;
- a common control path; and
- a common radiator path.

The common radiator path is composed of a radiator ST, a filter FI and a transmit/receive switch, e.g., a circulator ZI.

The receiving path includes an amplitude limiter LI for the HF signal to be received and a subsequently connected highly sensitive low-noise amplifier LNA.

The transmission path includes an amplifier or a series connection of a plurality of amplifiers for the HF signal to be transmitted, e.g., namely a driver amplifier DA, a power amplifier PA and a high power amplifier HPA.

The common control path is composed of a series connection of a phase shifter PS, an HF amplifier AMP and an HF attenuator ATT.

An HF signal Tx to be transmitted travels over a first switch SPDT1, the control path, a second switch SPDT2, the transmission path and the radiator path to the radiator ST, e.g., a horn radiator.

An HF signal received by radiator ST travels over the radiator path, the receiving path, the first switch SPDT1, the control path and the second switch SPDT2 to an output where it appears as an amplified received signal Rx and can be processed further.

Transmitter (S) or receiver (R) modules can be produced by omitting the receiving or transmission path, respectively.

It is evident that in such arrangements the low-noise amplifier LNA present in the receiving path must be specially protected against input signals whose amplitudes are too high and which would lead to destruction or an overshooting condition of amplifier LNA. Such unduly high amplitudes may occur in the receiving path, for example, if the circulator ZI is defective and couples the amplified transmission signal directly into the receiving path. Moreover, the radiator ST may receive an HF signal having an unduly high amplitude, for example, due to a lightning strike or an HF reflector disposed immediately in front of the radiator. It is therefore obvious to protect the amplifier LNA by placing an amplitude limiter LI at its input. The amplitude limiter must have the lowest possible (insertion) attenuation so that the received signal is attenuated as little as possible and, in the receiving mode, the noise figure of the T/R module remains as low as possible.

For that reason, reflecting amplitude limiters are employed. If a maximum permissible HF threshold level is exceeded, such amplitude limiters produce an HF short circuit. This causes the excessive HF power to be conducted in an unwanted manner over the low-resistance path of the circulator ZI to the output end of the transmission path and may damage or even destroy the circulator.

SUMMARY OF THE INVENTION

It is an object of the invention to provide a reflecting type amplitude limiter of this type which provides reliable protection against unduly high amplitudes for the receiving path as well as for a possibly-provided transmission path, operates reliably, occupies the smallest possible space and can be manufactured cost-effectively. It is another object of the invention to provide advantageous uses for such an amplitude limiter.

This is accomplished by an amplitude limiter for reflecting an input signal exceeding a predetermined amplitude threshold, the limiter including an input power divider having an input, a first output and a second output, an output power combiner having a first input, a second input and an output, first and second circuit branches each having a first end and a second end and being substantially identical electrically parallel-connected branches, such that the first end of the first and second circuit branches are respectively coupled to the first and second outputs of the input power divider and the second end of the first and second circuit branches are respectively coupled to the first and second inputs of the output power combiner, with each circuit branch composed of a series connection of first and second conductor sections, and with the first and second conductor sections having respectively different lengths and the first and second conductor sections of each circuit branch connected in anti-parallel, a first absorber resistor having first and second ends such that the first and second ends of the first absorber resistor are connected between the first and second outputs of the input power divider, first and second rectifiers with each respective rectifier connected between a connection point between the first and second conductor sections of each respective circuit branch and a ground conductor, and a second absorber resistor having first and second ends such that the first and second ends of the second absorber resistor are connected between the first and second inputs of the output power combiner. Advantageous embodiments and/or modifications are disclosed below.

A first advantage of the invention is that, in the non-limiting mode (normal mode) very little insertion attenuation exists for the HF received signal.

A second advantage is that, in the limiting mode, the destructive HF power is reflected in the amplitude limiter and is absorbed at least to such an extent that the reflected HF power is no longer able to cause any destruction to other components.

A third advantage is that, depending on the frequency of the HF received signal, it is possible to provide for an almost complete stripline structure. This makes the arrangement mechanically robust, requires very little space and can be manufactured very cost-effectively. Thus, it is even possible to integrate the amplitude limiter on the carrier substrate of a T/R or R module. The amplitude limiter is, therefore, not necessarily a discrete component.

A fourth advantage is that the signal amplitude limitation is caused only by the received HF signal. No control signals are needed. Because of its manner of operation, the amplitude limiter must, therefore, be considered to be a purely passive HF component.

A fifth advantage is that only two HF rectifiers are required for signal amplitude limitation, and these are advantageously configured as semiconductor diodes.

A sixth advantage is that the HF rectifiers can easily be supplied with a direct voltage and/or low-frequency bias, if necessary. Thus, it is possible, for example, to set both rectifiers as accurately as possible to a predetermined amplitude threshold or to even make the threshold controllable or adjustable.

BRIEF DESCRIPTION OF THE DRAWINGS

For a more complete understanding of the present invention and the advantages thereof, reference may now be made to the following description taken in conjunction with the accompanying drawings.

Referring to the drawings.

DETAILED DESCRIPTION OF THE PREFERRED EMBODIMENT

Figure 2:
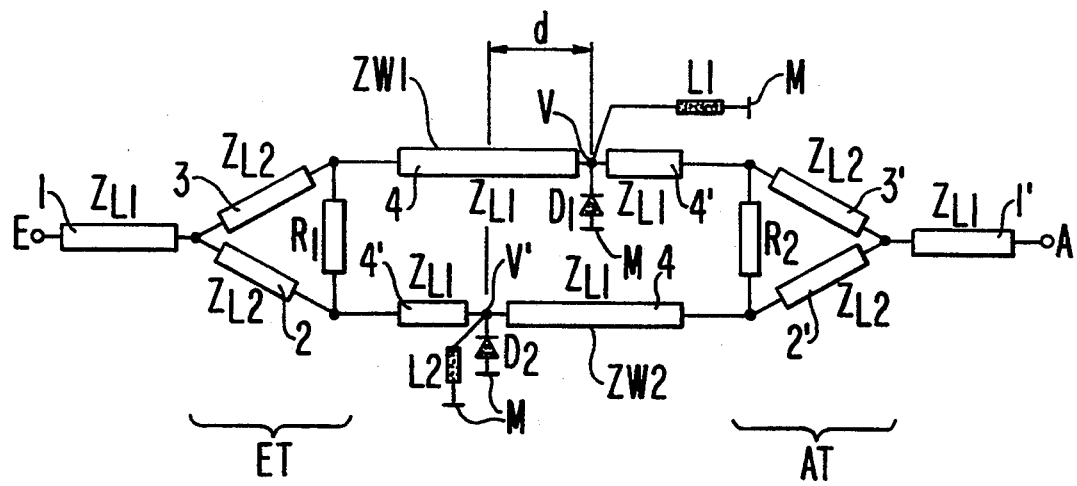
FIG. 2 is a schematic diagram of an amplitude limiter according to the present invention.

The invention will now be described in greater detail with reference to an embodiment that is schematically illustrated in FIG. 2. All stated values hereinafter refer to the wavelength $\lambda$ of the HF received signal in the arrangement. FIG. 2 depicts the electrical circuit of an amplitude limiter that can be produced, for example, in the form of a microstripline structure on a ceramic or plastic substrate. Only two passage holes (via holes) are required in the substrate into which the semiconductor rectifier diodes D1, D2 are inserted and contacted with the rear face of the substrate (HF ground). In addition, two additional passage holes may be required, namely if HF inductances L1, L2 are required each having one terminal which is also connected to the HF ground in the illustrated manner. These HF ground connections may possibly be replaced by direct voltage or low frequency alternating voltage terminals should this be necessary, for example, if it is required that the limiting amplitude thresholds determined by HF rectifiers D1, D2 must be set exactly alike. All remaining electrical components shown in FIG. 2 can be produced on a surface side of a substrate, for example, as etched conductor path structures and/or as screen-printed circuits, particularly for the HF absorber resistors $R_1$, $R_2$. As an alternative, it is possible, for example, to employ so-called SMD (surface mounted devices) resistors for absorber resistors $R_1$, $R_2$ and to solder them onto the illustrated conductor structures or glue them on the conductor structures in an electrically conductive manner. These HF absorber resistors $R_1$, $R_2$ convert the reflected HF power to heat as will be described in greater detail below. All remaining HF components shown in FIG. 2, marked with the capital letter Z and a subscript index, are composed of the exemplarily mentioned microstriplines. The illustrated amplitude limiter has the same characteristic impedance of, for example, 50 $\Omega$ at its input E and at its output A, as is presently customary in the HF art.

A received HF signal present at input E is initially fed to a 1:1 HF power input divider ET, is then divided to two parallel connected branches ZW1, ZW2 and thereafter combined again in a 1:1 HF power output combiner (divider) AT into an output signal that appears at output A. This output signal can only have a maximum HF amplitude as predetermined by rectifier diodes $D_1$, $D_2$. The input line 1 and the output line 1' each have a characteristic impedance $Z_{L1} = 50\ \Omega$. The signal coming from input line 1 is fed to input divider ET. The latter is composed of two conductor sections 2, 3, each having the same length $l = \lambda/4$ and the same characteristic impedance $Z_{L2} = 70.7\ \Omega$. The ends of input divider ET facing away from input line 1 are bridged by ohmic resistor $R_1 = 100\ \Omega$. The branches ZW1, ZW2 following input divider ET each include a series connection of two line sections 4, 4' of unequal length, each which have a characteristic impedance of $Z_{L1} = 50\ \Omega$. In each branch, the total length of line sections 4, 4' is insignificantly longer than $\lambda/4$. Line sections 4, 4' are connected in anti-parallel in branches ZW1, ZW2; this means, with respect to the input divider ET, a series connection of a long line section 4 and a short line section 4' exists in the first branch ZW1, while a series connection of the short line section 4' and the long line section 4 exists in the second branch ZW2.

The connection points V, V' are spaced at a distance $d = \lambda/4$. Limiter diodes $D_1$ and $D_2$ are respectively connected between connection points V, V' and HF ground M, and selectively inductances L1 and L2, respectively, are connected in parallel therewith. These inductances are advantageously configured as etched, so-called spiral inductances and are dimensioned in such a way that the HF current is unable to flow to HF ground M. The output combiner AT has the same configuration as input divider ET. It is merely necessary to have a mirror symmetrical arrangement of the components.

If now, in normal operation, the HF received signal present at input E has a level that lies below the maximum permissible threshold level set by limiter diodes $D_1$, $D_2$, limiter diodes $D_1$, $D_2$ are blocked with respect to HF and, therefore, have a high HF impedance. The arrangement shown in FIG. 2 is then a component that is comparable to a normal 50 $\Omega$ HF conductor section, has a low insertion attenuation, e.g., less than 0.3 dB, and a good input and output impedance with respect to HF. The deviations from an exemplarily employed characteristic impedance of 50 $\Omega$ are less than, for example, 7%. In normal operation, this advantageously results in a negligible increase in the noise figure in the receiving path and a negligible change in the phase of the received HF signal.

If, in the limitation mode, the received HF signal present at input E has a level which is greater than or equal to the maximum permissible threshold level set by limiter diodes $D_1$, $D_2$, limiter diodes $D_1$, $D_2$ become conductive with respect to HF and form an HF short circuit between connection points V, V' and HF ground M. Thus, the HF signals coming from the input and split into branches ZW1, ZW2 are reflected at limiter diodes $D_1$, $D_2$; therefore, a reflection coefficient $r = -1$ at each diode exists. Due to the mentioned spacing $d = \lambda/4$ of limiter diodes $D_1$, $D_2$, a signal path length difference $L = 2 \cdot \lambda/4 = \lambda/2$ now appears in the first branch ZW1 with respect to second branch ZW2 causing the reflected signal components in absorber resistor $R_1$ to be converted into thermal power loss (heat).

In the described amplitude limitation mode, a direct current and/or a low frequency current is generated at connection points V, V'. These unwanted currents are conducted by of inductances L1, L2 to the HF ground M. As an alternative, it is possible to connect the HF ground terminal of inductances L1, L2 to a low-resistance direct voltage terminal. With such a bias across limiter diodes $D_1$, $D_2$, the maximum permissible threshold level of the limiter can be changed. It is even possible to control or regulate the threshold level of the limiter. It is possible in a particularly advantageous manner to set the two limiter diodes $D_1$, $D_2$ for precisely the same maximum permissible HF threshold level, thus being able to compensate, for example, for manufacturing tolerances in limiter diodes $D_1$, $D_2$.

Figure 1:
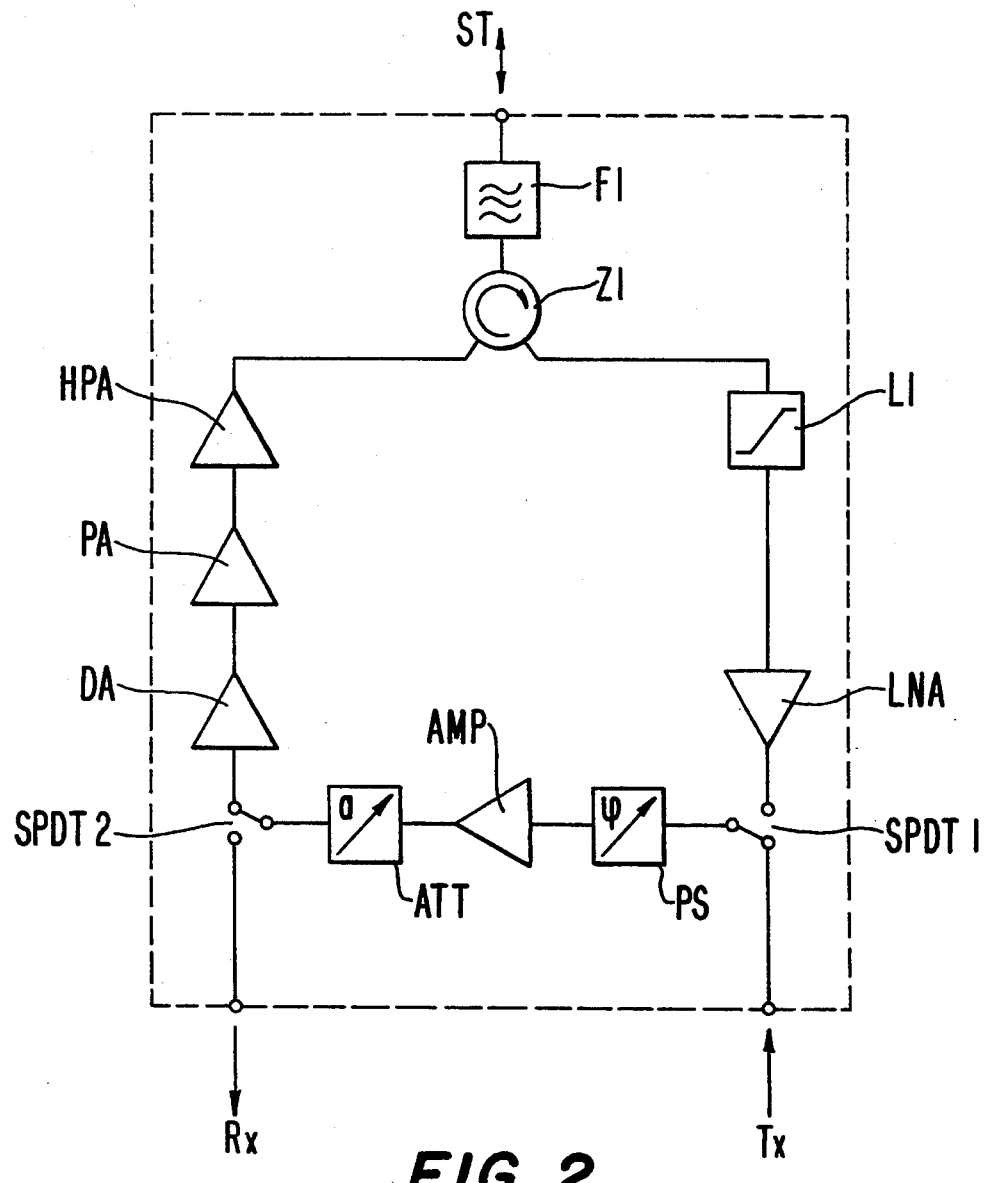
FIG. 1 is an exemplary configuration of a transmit/-receive module having an amplitude limiter according to the present invention.

These described characteristics thus reliably protect the amplifier LNA (FIG. 1), which is connected to the output of the amplitude limiter, against unduly high signal levels in the receiving path. Since, moreover, the two reflected HF signal components are essentially converted completely into heat in absorber resistor $R_1$, there is at most a negligible additional load on the amplifier chain in the transmission path of the T/R module (FIG. 1) via the low-resistance HF path of the T/R switch (circulator ZI). The output of the transmission path is thus protected. Another advantage is that, in the amplitude limiting mode, the adaptation of the amplitude limiter of FIG. 2 with respect to HF remains essentially constant with reference to the non-limited, normal operating mode. The maximum permissible HF input signal level can be selected by selection of the thermal load capacity of the absorber resistors $R_1$, $R_2$ and the maximum electrical load of limiter diodes $D_1$, $D_2$.

The invention is not limited to the described embodiment, but can be used in the same sense for other embodiments. For example, the spirally etched inductances L1, L2 may be replaced by coils having the same inductances. Moreover, the described striplines may be replaced by corresponding HF lines, e.g., HF cables.

The symmetrical configuration shown in FIG. 2 further makes it possible to use the amplitude limiter in many ways, for example, as an HF level limiter in a bidirectionally operated HF transmission path. An HF signal having a high level present at output A (FIG. 2) also leads to the initiation of the limiting mode. The power loss (heat) is then generated in the absorber resistor $R_2$.

We claim:

1. An amplitude limiter for reflecting an input signal exceeding a predetermined amplitude threshold, the limiter comprising:
   an input power divider having an input, a first output and a second output;
   an output power combiner having a first input, a second input and an output;
   first and second circuit branches each having a first end and a second end and being substantially identical electrically parallel-connected branches, the first end of the first and second circuit branches being respectively coupled to the first and second outputs of the input power divider, the second end of the first and second circuit branches being respectively coupled to the first and second inputs of the output power combiner, each circuit branch being composed of a series connection of first and second conductor sections, the first and second conductor sections having respectively different lengths, the first and second conductor sections of each circuit branch being connected in anti-parallel;
   a first absorber resistor having first and second ends, the first and second ends of the first absorber resistor being connected between the first and second outputs of the input power divider;
   first and second rectifiers, each respective rectifier being connected between a connection point between the first and second conductor sections of each respective circuit branch and a ground conductor; and
   a second absorber resistor having first and second ends, the first and second ends of the second absorber resistor being connected between the first and second inputs of the output power combiner.

2. An amplitude limiter according to claim 1, wherein at least one of the input power divider and output power combiner has a y-shaped structure and is constructed of conductor sections.

3. An amplitude limiter according to claim 1, wherein the rectifiers are semiconductor diodes.

4. An amplitude limiter according to claim 1, further comprising first and second inductors respectively connected between the connection points between the first and second conductor sections of each respective circuit branch and a predetermined potential, and wherein the first and second inductors block high frequencies.

5. An amplitude limiter according to claim 1, wherein the input power divider, the output power combiner and the first and second circuit branches are formed using stripline technology.

6. An amplitude limiter according to claim 1, wherein the absorber resistor is a printed resistor.

7. An amplitude limiter according to claim 1, wherein the anti-parallel connection of the branches creates an electrical distance of $\lambda/4$ between the respective connection point between the first and second conductive sections of the respective circuit branches, where $\lambda$ is a wavelength of the input signal.

8. An amplitude limiter according to claim 1, further comprising a receiving stage of a high-frequency receiver coupled to receive the output signal.

9. An amplitude limiter according to claim 1, further comprising a transceiver module for high-frequency signals, wherein a receiving path of the transceiver is coupled to receive the output signal.

10. An amplitude limiter according to claim 1, further comprising a receiving stage of a radar receiver coupled to receive the output signal.

11. An amplitude limiter according to claim 1, wherein the amplitude limiter is a high-frequency amplitude limiter.

* * * * *